United States Patent [19]

Tsang

[11] Patent Number: 4,713,141
[45] Date of Patent: Dec. 15, 1987

[54] ANISOTROPIC PLASMA ETCHING OF TUNGSTEN

[75] Inventor: Chi-Hwa Tsang, Beaverton, Oreg.
[73] Assignee: Intel Corporation, Santa Clara, Calif.
[21] Appl. No.: 910,078
[22] Filed: Sep. 22, 1986
[51] Int. Cl.⁴ .......................... C23F 1/02; B44C 1/22; C03C 15/00; C03C 25/06
[52] U.S. Cl. ..................................... 156/643; 156/646; 156/652; 156/656; 156/659.1; 156/626; 204/192.35; 252/79.1
[58] Field of Search ............... 156/643, 646, 652, 656, 156/659.1, 662, 626; 204/192 E, 192.35; 427/38, 39; 252/79.1

[56] References Cited

U.S. PATENT DOCUMENTS

| | | | |
|---|---|---|---|
| 4,465,553 | 8/1984 | Hijikata et al. | 252/79.1 X |
| 4,473,435 | 9/1984 | Zafiropoulo et al. | 252/79.1 X |
| 4,473,436 | 9/1984 | Beinvogl | 252/79.1 X |
| 4,579,623 | 4/1986 | Suzuki et al. | 156/643 X |

OTHER PUBLICATIONS

Tang et al., "Tungsten Etching INCF₄ and SF₆ Discharges," Journal of the Electro-Chemical Society, Jan. 1984, pp. 115–120, vol. 131, No. 1.
Mehta et al., "Blanket CVD Tungsten Interconnect for VLSI Devices," V-MIC Conf. Jun. 9–10, 1986, pp. 418–435.
Picard et al., "Plasma Etching of Refractory Metals (W, MO, TA) and Silicon in SF₆ and SF₆-O₂. An Analysis of the Reaction Products," Plasma Chemistry and Plasma Processing, vol. 5, No. 4, 1985, pp. 333–351.
Degenkolb et al., "Selective Dry Etching of Tungsten for VLSI Metalization," Journal of the Electro-Chemical Society, Abstract No. 244, 167th Society Meeting vol. 85-1, 1985, p. 353.

*Primary Examiner*—William A. Powell
*Attorney, Agent, or Firm*—Blakely, Sokoloff, Taylor & Zafman

[57] ABSTRACT

An anisotropic plasma etching of a tungsten metal film of a semiconductor device is disclosed. The device is placed in a plasma etcher using SF₆ and Cl₂ gas mixture to anisotropically etch the tungsten metal film layer.

16 Claims, 6 Drawing Figures

ANISOTROPIC PLASMA ETCHING OF TUNGSTEN

BACKGROUND OF THE INVENTION

1. Field of the Invention

This invention relates to the field of plasma etching of tungsten and more specifically to the etching of a tungsten layer in the fabrication of a semiconductor device.

2. Prior Art

In the fabrication of high-density semiconductor devices, refractory metals are increasingly used as low-resistivity interconnect and contact barrier. These refractory metals provide an alternative to conventional Aluminum-based metallization. When used in very large scale intergration (VLSI) involving metal-oxide semiconductor (MOS) technology. Typically, these metals are deposited by various deposition techniques well-known in the prior art. Then these metals are patterned and etched using various prior art techniques. However, one of the more popular methods of etching is provided by plasma etching techniques. An advantage of plasma etching refractory metals is disclosed in an article titled by A. Picard and G. Turban; *Plasma Etching of Refractory Metals (W,MO,TA) and Silicon in $SF_6$ and $SF_6$-$O_2$, An Analysis of the Reaction Products;* Plasma Chemistry and Plasma Processing; Vol. 5, No. 4, 1985; pp 333–351.

One particular refractory metal, namely tungsten (W), has received favorable response for use in fabricating VLSI devices. Tungsten provides a high electromigration resistance and offers better step coverage and thermal stability when used as a metallization layer in the manufacturing of VLSI devices. Etching of tungsten is typically performed by the use of a dry plasma etching technique using $CF_4$, $SF_6$ or oxygen impregnated gas mixtures, such as $CF_4$ plus $O_2$, or $SF_6$ plus $O_2$. Although plasma etching is normally preferred, reactive ion etching also performs well, such as when $CF_3$ $Br$-$O_2$-$He$ gas mixture is used. Etching of tungsten using fluorinated gases or the $CF_3$ Br mixture are documented in an article by E. Degenkolb, M. Burba, S. Henck, M. Tabasky, E. Jungbluth; entitled *Selective Dry Etching of Tungsten for VLSI Metalization;* Abstract Number 244; Journal of the Electro-chemical Society; 167 Society Meeting Volume 85-1, 1985; p 353; and also in an article by C. C. Tang, D. W. Hess; titled *Tungsten Etching and $CF_4$ and $SF_6$ Discharges;* Journal of the Electrochemical Society; January 1984; pp 115–120.

There are several disadvantages related to etching tungsten by the prior arts methods described. The tungsten etch rate for $CF_3$ $Br$-$O_2$-$He$ plasma is too slow to be cost-effective. Also, the reactive ion etcher is more costly than a parallel plate plasma etcher. Further, fluorinated gases of the plasmas of $CF_4$, $SF_6$, $CF_4$ plus $O_2$ or $SF_6$ plus $O_2$ resulted in mask undercut while the tungsten was being etched. Still further, the range of oxygen concentration in $SF_6$ plus $O_2$ to provide anisotropic tungsten etch requires such small quantities of oxygen which prevent good process control.

It is appreciated that what is needed is a method to anisotropically etch a tungsten metal film in a conventional plasma etcher without undercutting the conventional photo resist mask, and yet, provide close process control over the etching cycle.

SUMMARY OF THE INVENTION

The present invention provides for anisotropic plasma etching of tungsten. The plasma is comprised of fluorinated and chlorinated gas mixtures wherein the fluorinated gases provide the etching and chlorinated gases react to provide a passivation layer along the side wall of the tungsten layer under the photoresist, such that an anisotropic etching of the tungsten results.

DETAILED DESCRIPTION OF THE PREFERRED EMBODIMENT

Present invention describes a method for anisotropically plasma etching a layer of tungsten film. In the following description, numerous specific details are set forth such as flow rates, electrode temperatures and an electrode gap, etc., in order to provide a more thorough understanding of the present invention. It will be obvious, however, to one skilled in the art, that the present invention may be practiced without these specific details. In other instances, well-known processes have not been described in detail in order not to unnecessarily obscure the present invention.

Figure 1:
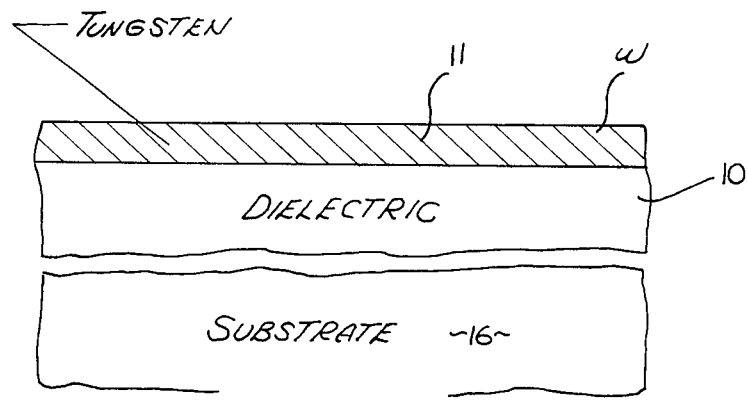
FIG. 1 is a cross-sectional view illustrating a formation of a tungsten layer over an underlying dielectric layer.
Figure 2:
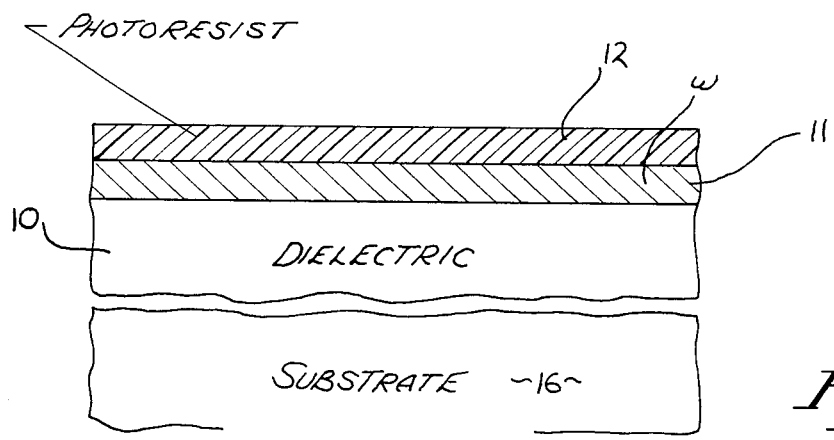
FIG. 2 is a cross-sectional view showing a formation of a photoresist layer over the tungsten layer.

Referring to FIG. 1, a layer of tungsten 11 is deposited over an underlying dielectric layer 10. The underlying dielectric layer 10 may be comprised of most any dielectric, such as an oxide; however, the underlying layer need not necessarily be of a dielectric material. Tungsten layer 11 may be deposited over another metal layer, a silicon or a polysilicon layer. Most any prior art deposition technique may be utilized to deposit tungsten layer 11. The preferred embodiment deposits a film of tungsten by a chemical vapor deposition (CVD) technique, then a photoresist layer 12 is formed above the tungsten layer 11. Such deposition of a photoresist layer 12 on tungsten layer 11 is well-known in the prior art as is the subsequent patterning of photoresist layer 12.

Figure 3:
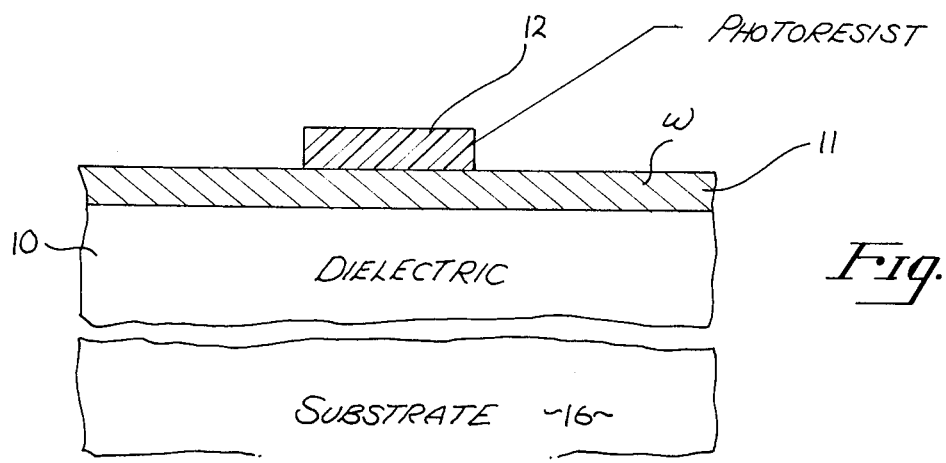
FIG. 3 is a cross-sectional view illustrating a patterning of the photo-resist layer.

Referring to FIG. 3, the photoresist layer 12 is exposed and developed such that the photoresist layer 12 remains only over a portion of layer 11 and functions as a mask for the etching of tungsten layer 11.

Figure 4:
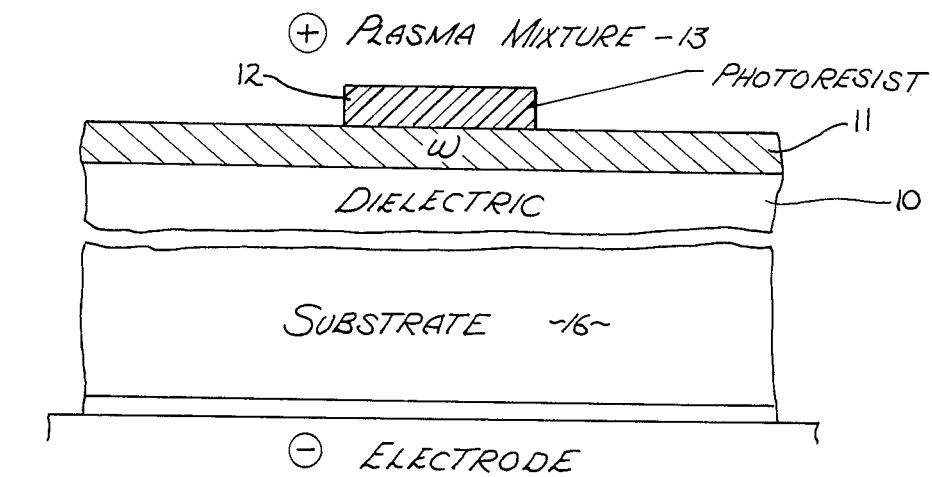
FIG. 4 is a cross-sectional view illustrating a placement of a semiconductor device on an electrode that is negatively charged due to a self-biased DC electrical potential developed by the presence of plasma.

Referring to FIG. 4, the semiconductor device 15 is introduced into a plasma etcher, wherein the plasma 13 is generated between two electrodes by applying radio-frequency electrical power to either electrode. Meanwhile, a self-biased direct-current electrical potential is developed between the positively biased plasma 13 and the negatively biased electrode 14. Although the preferred embodiment utilizes a single wafer, parallel-plate plasma etcher, most any prior art etcher may be utilized, such as batch etchers and reactive ion etchers. The preferred embodiment uses a single wafer, parallel plate plasma etcher mainly to reduce the cost of the required equipment.

The plasma 13 introduced into the etcher is comprised of a mixture of fluorinated and chlorinated gases. The preferred embodiment uses a mixture of $SF_6$ plus $Cl_2$, wherein the concentration of chlorine is between 20-50 percent mainly to increase the etch rate ratios of tungsten to photoresist and the underlying dielectric. The flow rate of the $SF_6$-$Cl_2$ mixture is at 100-200 sccm at pressures ranged from 200 to 400 mtorr. The electrode gap is set from 0.6 to 1.0 centimeters between two electrodes and the electrode temperature is at 20° C. The RF power supplied to the electrode is set at 150-275 watts. Also in the preferred embodiment, helium is introduced at flow rates of 20-40 sccm to improve the etch rate uniformity.

Figure 5:
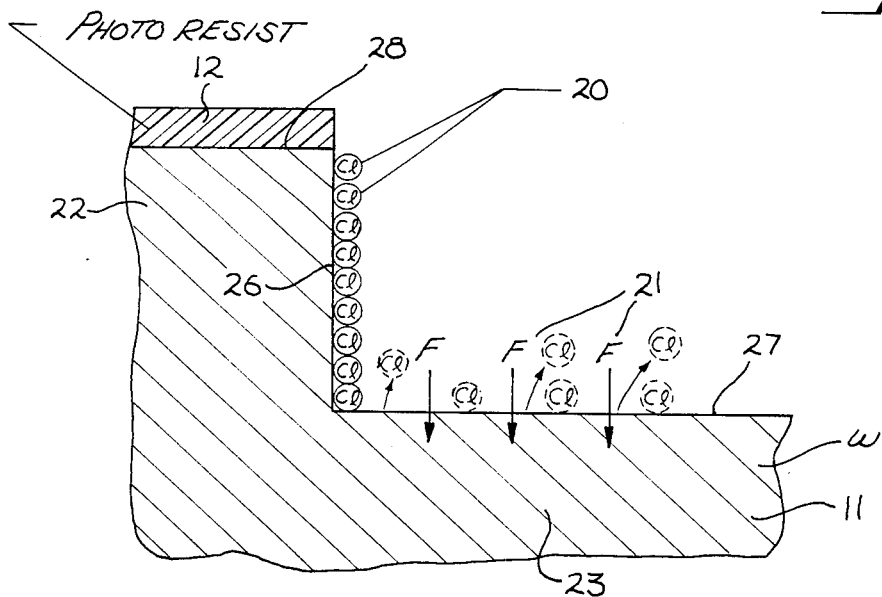
FIG. 5 is an expanded view illustrating the tungsten layer and a reaction of chlorinated and fluorinated gases on the tungsten layer.

Referring to FIG. 5, an expanded drawing illustrates the anisotropic properties of the present etching technique. Chlorine atoms 25 are absorbed on the surface of the exposed portion 23 of tungsten layer 11. The desorption of chlorine atoms induced by the ion bombardment and absorbtion of fluorine atoms 21 into the exposed portion 23 causes the etching of the exposed portion 23. However, portion 22 under photoresist layer 12 does not etch, because fluorine atoms 21 cannot penetrate into portion 22. The photoresist 12 prevents the penetration of fluorine atoms along the top surface 28 of portion 22. The tungsten side wall 26 covered by a layer of chlorine atoms is protected from being reacted with the fluorine atoms 21. Chlorine atoms 20 operate as an additive to passivate the side wall 26. The vertical stacking of chlorine atoms along the side wall 26 results only along the side wall and not along surface 27 is believed to be subsequently removed by the ion bombardment of the positive ions generated in the plasma 13 where its electrical DC potential is positive relative to the electrode. In essence, fluorine atoms 21 etch away tungsten 11 along surface 27 and will not attack the sidewall 26.

The tungsten etching process stops on the underlying layer 10 when a change in the intensity of the optical emission spectra of fluorine or tungsten fluoride is detected by a conventional gas emission end-point detection technique.

Figure 6:
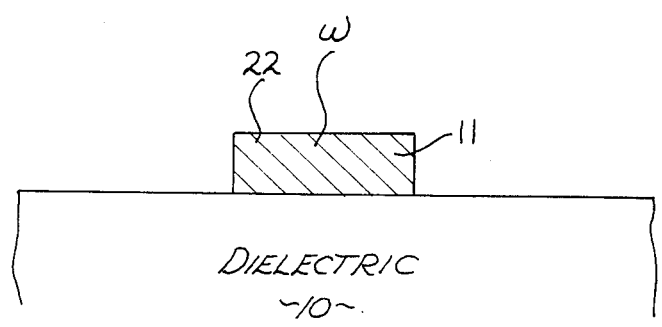
FIG. 6 is a cross-sectional view illustrating a formed tungsten layer after the etching process.

Finally in FIG. 6, a formed tungsten region 22 which originated from tungsten layer 11 is shown disposed above the underlying dielectric layer 10.

Although a particular gas mixture is disclosed with the preferred embodiment, the $SF_6$ gas can be replaced by other fluoride compounds such as $CF_4$, $NF_3$, etc. and the $Cl_2$ gas can be replaced by other chloride compounds, such as $CCl_2F_2$, $CCl_3F$, $CClF_3$, $CCl_4$, etc. Further, the etching apparatus can be replaced by a reactive ion etcher, plasma diode or triode etchers, magnetron etcher or other types of plasma etchers used in IC fabrication.

Thus, a novel technique to etch tungsten has been described.

I claim:

1. A process for anisotropic etching of tungsten, comprising the steps of:
   forming a plasma gas mixture having fluorinated and chlorinated gases;
   subjecting said tungsten to said plasma gas mixture;
   said chlorinated gases forming along side walls developed during said etching process and preventing etching of said side walls;
   whereby anisotropic etch of said tungsten is achieved.

2. The process defined by claim 1, wherein said plasma gas mixture is comprised of $SF_6$ and $Cl_2$.

3. The process defined by claim 2, wherein said plasma gas mixture has a chlorine concentration of approximately 20-50 percent.

4. The process defined by claim 3, further including the step of introducing helium into said plasma gas mixture.

5. A process for anisotropic etching of a tungsten layer in an etcher during a fabrication of a semiconductor device, comprising the steps of:
   forming a layer of photoresist on a predetermined surface of said tungsten layer;
   subjecting said tungsten layer to a mixture of fluorinated and chlorinated gases in said etcher;
   said chlorinated gases forming along side walls developed during said etching process and preventing etching of said side walls;
   said photoresist layer preventing said fluorinated gas from etching said tungsten layer except where said tungsten layer is exposed;
   applying RF power to electrodes wherein said gas mixture forms plasma;
   etching said tungsten until an underlying layer is exposed;
   whereby anisotropic etch of said tungsten is achieved.

6. The process defined by claim 5, wherein said plasma gas mixture is comprised of $SF_6$ and $Cl_2$.

7. The process defined by claim 6, wherein said plasma gas mixture has a chlorine concentration of approximately 20-50 percent.

8. The process defined by claim 7, further including the step of introducing helium into said plasma gas mixture.

9. The process defined by claim 5, wherein said electrical power is approximately 150-200 watts.

10. The process defined by claim 9, wherein said tungsten layer is deposited by a chemical vapor deposition process.

11. The process defined by claim 5, wherein said fluorinated gas is selected from the group consisting of $SF_6$, $CF_4$ and $NF_3$.

12. The process defined by claim 5, wherein said chlorinated gas is selected from the group consisting of $Cl_2$, $CCl_2F_2$, $CCl_3F$, $CClF_3$ and $CCl_4$.

13. A process for etching a tungsten film layer in a plasma etcher during a fabrication of a semiconductor device, comprising the steps of:
   forming a layer of photoresist on a predetermined surface of said tungsten film layer;
   placing said semiconductor device between electrodes in said plasma etcher;
   subjecting said tungsten layer to a mixture of $SF_6$ and $Cl_2$ at approximately 100-200 sccm at approximately 200-400 millitorr of pressure;
   applying electrical power of approximately 150-275 watts to said gas mixture to form a plasma;
   etching said tungsten until an underlying layer is exposed and detected using optical emission endpoint detection technique;
   whereby anisotropic etch is achieved.

14. The process defined by claim 13, wherein said plasma gas mixture has a chlorine concentration of approximately 20-50 percent.

15. The process defined by claim 14, further including the step of introducing helium into said plasma gas mixture.

16. The process defined by claim 15, wherein said electrode has a gap of 0.6-1.0 centimeters and an electrode temperature of 20° centigrade.

* * * * *